United States Patent
Yang et al.

(10) Patent No.: US 11,424,340 B2
(45) Date of Patent: Aug. 23, 2022

(54) MEMORY DEVICE AND METHOD OF FORMING THE SAME

(71) Applicant: Powerchip Semiconductor Manufacturing Corporation, Hsinchu (TW)

(72) Inventors: Wen Chung Yang, Miaoli County (TW); Shih Hsi Chen, Hsinchu County (TW); Wei-Chang Lin, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/019,328

(22) Filed: Sep. 13, 2020

(65) Prior Publication Data

US 2022/0037503 A1 Feb. 3, 2022

(30) Foreign Application Priority Data

Aug. 3, 2020 (TW) ................... 109126234

(51) Int. Cl.
| | |
|---|---|
| *H01L 29/49* | (2006.01) |
| *H01L 29/423* | (2006.01) |
| *H01L 29/788* | (2006.01) |
| *H01L 21/02* | (2006.01) |
| *H01L 29/66* | (2006.01) |

(Continued)

(52) U.S. Cl.
CPC ...... *H01L 29/4991* (2013.01); *H01L 21/0223* (2013.01); *H01L 21/02247* (2013.01); *H01L 21/02252* (2013.01); *H01L 21/31111* (2013.01); *H01L 21/764* (2013.01); *H01L 29/40114* (2019.08); *H01L 29/42324* (2013.01); *H01L 29/66825* (2013.01); *H01L 29/7883* (2013.01)

(58) Field of Classification Search
CPC ............. H01L 29/4991; H01L 21/0223; H01L 21/02247; H01L 21/02252; H01L 21/31111; H01L 21/764; H01L 29/40114; H01L 29/42324; H01L 29/66825; H01L 29/7883; H01L 27/11517; H01L 27/11521; H01L 27/11526; H01L 27/11548; H01L 29/72324; H01L 29/42328; H01L 29/7841; H01L 29/788; H01L 29/7881
See application file for complete search history.

(56) References Cited

U.S. PATENT DOCUMENTS

| | | | | |
|---|---|---|---|---|
| 6,100,559 A | * | 8/2000 | Park .................. | H01L 21/28061 257/315 |
| 7,704,851 B2 | * | 4/2010 | Kim ................... | H01L 27/11521 438/257 |

(Continued)

*Primary Examiner* — Eduardo A Rodela
(74) *Attorney, Agent, or Firm* — JCIPRNET

(57) ABSTRACT

Provided is a memory device including a substrate, a plurality of word-line structures, a plurality of cap structures, and a plurality of air gaps. The word-line structures are disposed on the substrate. The cap structures are respectively disposed on the word-line structures. A material of the cap structures includes a nitride. The nitride has a nitrogen concentration decreasing along a direction near to a corresponding word-line structure toward far away from the corresponding word-line structure. The air gaps are respectively disposed between the word-line structures. The air gaps are in direct contact with the word-line structures. A method of forming a memory device is also provided.

10 Claims, 6 Drawing Sheets

(51) Int. Cl.
*H01L 21/311* (2006.01)
*H01L 21/764* (2006.01)
*H01L 21/28* (2006.01)

(56) References Cited

U.S. PATENT DOCUMENTS

| | | | | |
|---|---|---|---|---|
| 8,435,877 | B2* | 5/2013 | Yang | H01L 21/28247 |
| | | | | 438/266 |
| 9,748,311 | B2* | 8/2017 | Fantini | H01L 45/144 |
| 2007/0096202 | A1 | 5/2007 | Kang et al. | |
| 2009/0251972 | A1* | 10/2009 | He | H01L 29/66833 |
| | | | | 365/185.28 |
| 2011/0303967 | A1* | 12/2011 | Harari | H01L 27/11568 |
| | | | | 257/321 |
| 2019/0067080 | A1* | 2/2019 | Chiu | H01L 27/11521 |
| 2019/0081177 | A1* | 3/2019 | Hsieh | H01L 21/0234 |

\* cited by examiner

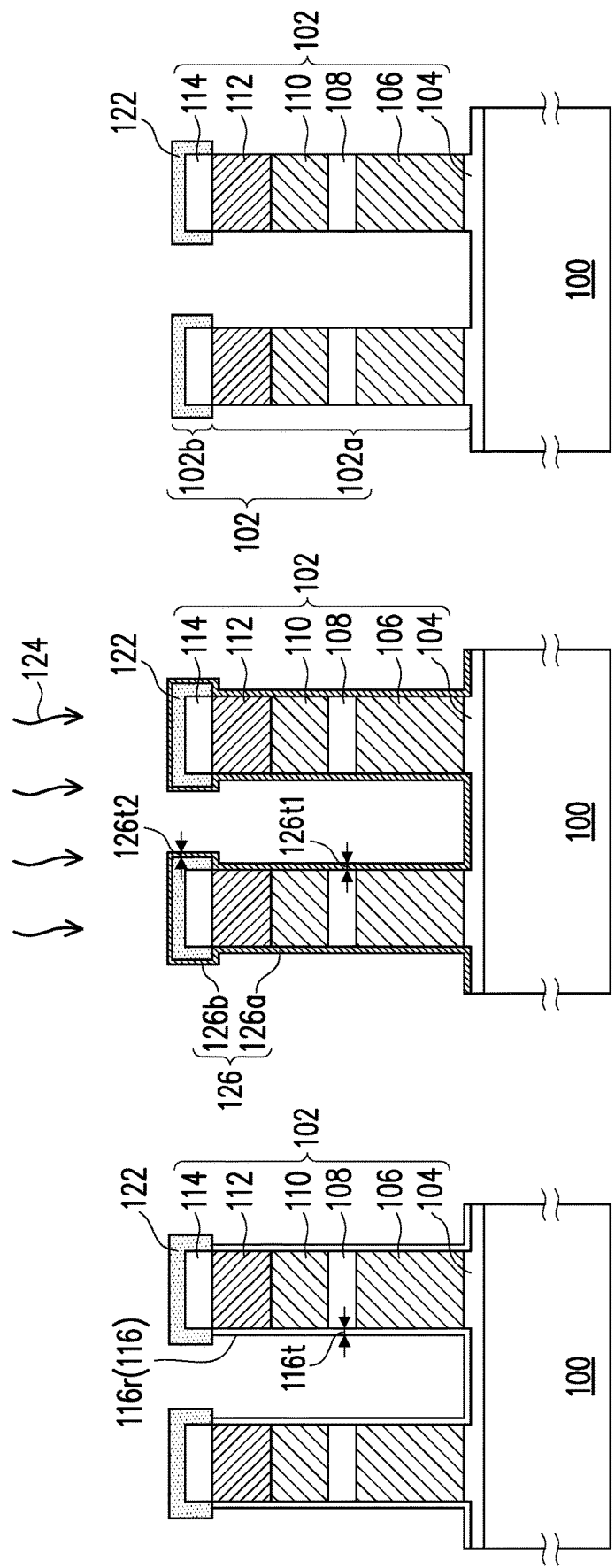

MEMORY DEVICE AND METHOD OF FORMING THE SAME

CROSS-REFERENCE TO RELATED APPLICATION

This application claims the priority benefit of Taiwan application serial no. 109126234, filed on Aug. 3, 2020. The entirety of the abovementioned patent application is hereby incorporated by reference herein and made a part of this specification.

BACKGROUND OF THE INVENTION

Field of the Invention

The present invention relates to a memory device and a method of forming the same.

Description of Related Art

A flash memory has the advantages of being able to write, read, and erase data multiple times, and the stored data will not disappear after the power is turned off, so it has become a non-volatile memory device which is widely used in personal computers and electronic products.

With the advancement of science and technology, various electronic products are developing towards the trend of lightness, thinness and compact size. However, under this trend, the critical dimension of the flash memory is also gradually shrinking, which causes the manufacturing process of the flash memory to face many challenges. For example, as the integration density of the flash memory continues to increase, the coupling interference between the memory cells also increases, thereby affecting the durability and reliability of the flash memory.

SUMMARY OF THE INVENTION

The invention provides a memory device and a method of forming the same in which can increase the air gap ratio between the word-line structures, so as to enhance the program speed and endurance of the memory device, and improve the coupling interference between the word-line structures, thereby increasing the reliability of the memory device.

The invention provides a memory device including a substrate, a plurality of word-line structures, a plurality of cap structures, and a plurality of air gaps. The plurality of word-line structures are disposed on the substrate. The plurality of cap structures are respectively disposed on the plurality of word-line structures. A material of the plurality of cap structures includes a nitride. The nitride has a nitrogen concentration decreasing along a direction near to a corresponding word-line structure toward far away from the corresponding word-line structure. The plurality of air gaps are respectively disposed between the plurality of word-line structures. The plurality of air gaps are in direct contact with the plurality of word-line structures.

In one embodiment of the invention, the word-line structure includes a tunneling dielectric layer; a floating gate, disposed on the tunneling dielectric layer; a control gate, disposed on the floating gate; an inter-gate dielectric layer, disposed between the floating gate and the control gate; a metal layer disposed on the control gate; and a hard mask layer, disposed on the metal layer.

In one embodiment of the invention, one of the plurality of cap structures covers a top surface and a sidewall of the hard mask layer.

In one embodiment of the invention, the memory device further includes a dielectric layer disposed on the plurality of cap structures and extending between two adjacent cap structures.

In one embodiment of the invention, the cap structure includes a single-layered structure, a two-layered structure, or a multi-layered structure.

In one embodiment of the invention, two adjacent cap structures are connected to each other.

The invention provides a method of forming a memory device including: (a) forming a word-line structure on a substrate; (b) conformally forming a nitride layer on the word-line structure; (c) forming a sacrificial pattern on the nitride layer to expose an upper portion of the nitride layer; (d) performing a nitridation treatment to nitride the upper portion of the nitride layer into a first cap layer; (e) removing the sacrificial pattern to expose a lower portion of the nitride layer; (f) performing an etching process to thin the lower portion of the nitride layer; (g) performing an oxidation process to oxidize a thinned lower portion of the nitride layer to an oxide layer; and (h) removing the oxide layer to expose a lower portion of the word-line structure, while the first cap layer covers an upper portion of the word-line structure.

In one embodiment of the invention, the method further includes: repeating steps (b) to (h) at least once to form a second cap layer on the first cap layer, wherein the first cap layer has a nitrogen concentration higher than a nitrogen concentration of the second cap layer.

In one embodiment of the invention, the method further includes: repeating steps (b) to (h) at least twice to form a second cap layer on the first cap layer and form a third cap layer on the second cap layer, wherein the first cap layer has a nitrogen concentration higher than a nitrogen concentration of the second cap layer, and the second cap layer has the nitrogen concentration higher than a nitrogen concentration of the third cap layer.

In one embodiment of the invention, after forming the third cap layer, the method further includes: forming a dielectric layer on the third cap layer to seal an air gap between two adjacent word-line structures, wherein the air gap is in direct contact with the two adjacent word-line structures.

In one embodiment of the invention, after performing the step (f), the thinned lower portion of the nitride layer has a thickness less than or equal to 2 nm.

In one embodiment of the invention, after performing the step (g), the oxide layer further extends to cover a surface of the first cap layer.

In one embodiment of the invention, performing the nitridation treatment includes performing a plasma nitridation process.

In one embodiment of the invention, performing the nitridation treatment includes performing an annealing process after performing the plasma nitridation process.

In one embodiment of the invention, the etching process includes a wet etching process by using a diluted hydrofluoric acid (DHF) solution.

In one embodiment of the invention, the oxidation process includes introducing process gases including $H_2$, $O_2$, and Ar, and a content of $H_2$ is greater than a content of $O_2$.

In one embodiment of the invention, after forming the first cap layer, the method further includes: forming a dielectric layer on the first cap layer, wherein the dielectric layer extends to cover sidewalls of two adjacent word-line structures, so as to form an air gap between the two adjacent word-line structures.

The invention provides a memory device including a substrate, a plurality of word-line structures, a plurality of cap structures, and a dielectric layer. The plurality of word-line structures are disposed on the substrate. The plurality of cap structures are respectively disposed on the plurality of word-line structures. A material of the plurality of cap structures includes a nitride. The nitride has a nitrogen concentration decreasing along a direction near to a corresponding word-line structure toward far away from the corresponding word-line structure. The dielectric layer is disposed on the plurality of cap structures and extending to cover sidewalls of the plurality of word-line structures, so as to form a plurality of air gaps between the plurality of word-line structures.

In one embodiment of the invention, the word-line structure includes a tunneling dielectric layer; a floating gate, disposed on the tunneling dielectric layer; a control gate, disposed on the floating gate; an inter-gate dielectric layer, disposed between the floating gate and the control gate; a metal layer disposed on the control gate; and a hard mask layer, disposed on the metal layer.

In one embodiment of the invention, the cap structure includes a single-layered structure, a two-layered structure, or a multi-layered structure.

Based on the above, in the embodiment of the present invention, the cap structure with a single-layered structure or a multi-layered structure is formed on the word-line structure, so as to control the amount of the dielectric layers subsequently filling in the space between adjacent word-line structures, thereby maximizing the air gap ratio between the word-line structures. In this case, the said maximized air gap ratio is able to effectively increase the program speed and endurance of the memory device, and improve the coupling interference between the word-line structures, thereby increasing the reliability of the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1J are schematic cross-sectional views illustrating a manufacturing process of a memory device according to a first embodiment of the invention.

DESCRIPTION OF THE EMBODIMENTS

Figure 1C:
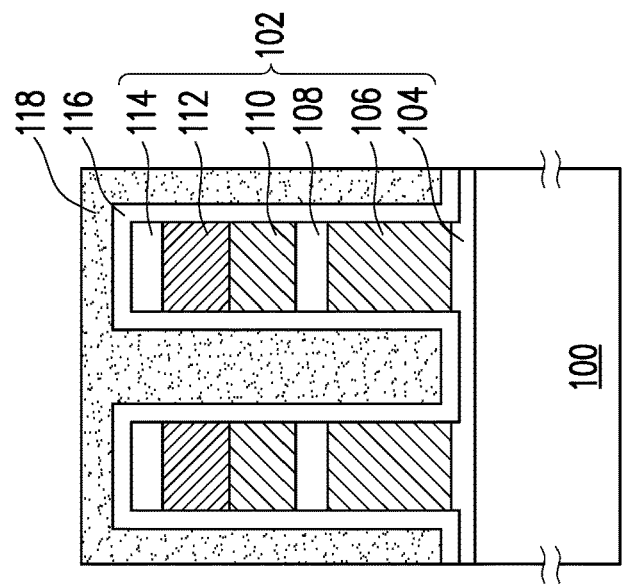

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1J are schematic cross-sectional views illustrating a manufacturing process of a memory device according to a first embodiment of the invention. The memory device described in the following embodiments may be a flash memory. However, the invention is not limited thereto. In other embodiments, the memory device may also be a dynamic random access memory (DRAM), a NOR flash memory, an Embedded flash memory, or a combination thereof.

Figure 1B:
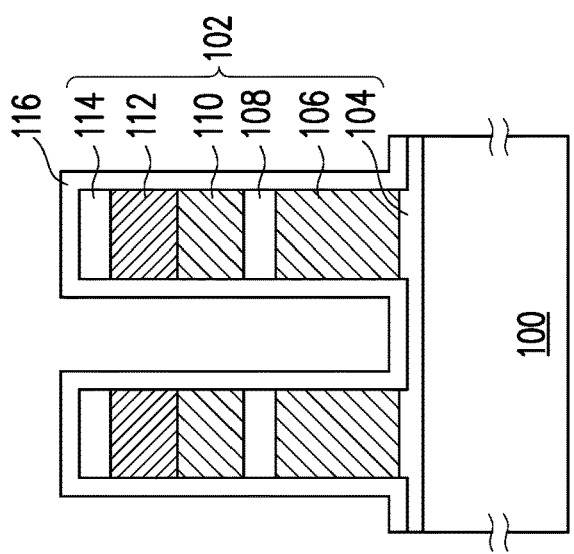
Figure 1A:
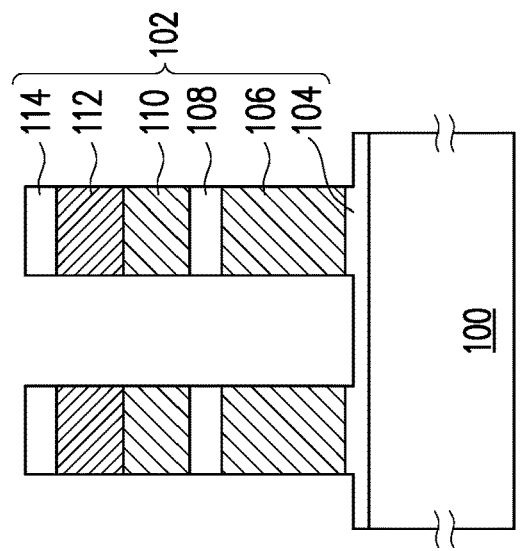

Referring to FIG. 1A, first, a substrate 100 is provided. In some embodiments, the substrate 100 includes a semiconductor substrate, a silicon on insulator (SOI) substrate, or a combination thereof. In the embodiment, the substrate 100 may be a silicon substrate.

Next, a plurality of word-line structures 102 are formed on the substrate 100. Specifically, each word-line structure 102 includes a tunneling dielectric layer 104, a floating gate 106, an inter-gate dielectric layer 108, a control gate 110, a metal layer 112, and a hard mask layer 114 from bottom to top. In some embodiments, the tunneling dielectric layer 104 includes a silicon oxide layer, which may extend to cover a top surface of the substrate 100, so as to connect adjacent word-line structures 102. The floating gate 106 includes a polysilicon layer. The inter-gate dielectric layer 108 includes a single-layered structure or a multi-layered structure. For example, the inter-gate dielectric layer 108 may be a composite layer composed of oxide/nitride/oxide (ONO). The control gate 110 includes a polysilicon layer. The metal layer 112 includes a tungsten (W) layer. The hard mask layer 114 includes a silicon nitride layer.

Referring to FIG. 1B, a nitride layer 116 is formed on the substrate 100. The nitride layer 116 conformally covers surfaces of the word-line structures 102 and the top surface of the substrate 100. In some embodiments, the nitride layer 116 may be a silicon nitride layer with a thickness of about 3 nm to 5 nm. In this embodiment, the nitride layer 116 may be formed by an atomic layer deposition (ALD), but the invention is not limited thereto. In other embodiments, the nitride layer 116 may be formed by a chemical vapor deposition (CVD).

Referring to FIG. 1C, a sacrificial layer 118 is formed on the nitride layer 116. The sacrificial layer 118 fills into a space between the word-line structures 102 and extends to cover the top surface of the nitride layer 116. In some embodiments, a material of the sacrificial layer 118 includes photoresist, polysilicon, or a combination thereof.

Figure 1D:
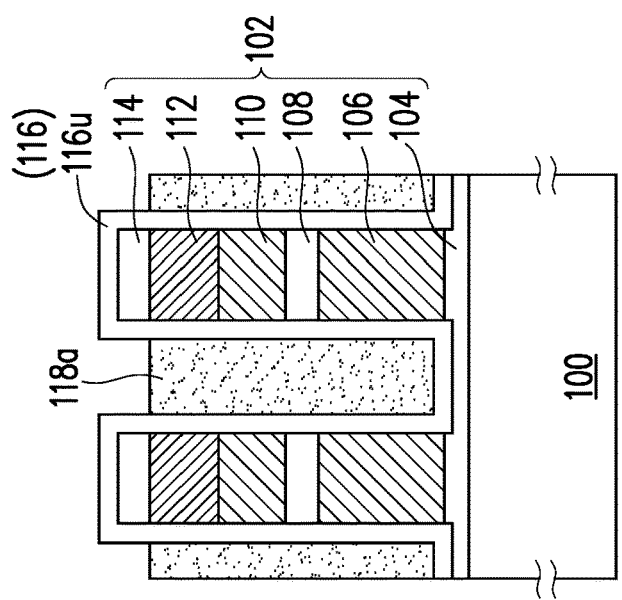

Referring to FIG. 1C and FIG. 1D, the sacrificial layer 118 is etched back to form a sacrificial pattern 118a between the word-line structures 102. In the case, the sacrificial pattern 118a exposes an upper portion 116u of the nitride layer 116. In the embodiment, as shown in FIG. 1D, a top surface of the sacrificial pattern 118a is substantially flush with a top surface of the metal layer 112, but the invention is not limited thereto. In other embodiments, the top surface of the sacrificial pattern 118a may be higher than the top surface of the metal layer 112.

Figure 1E:
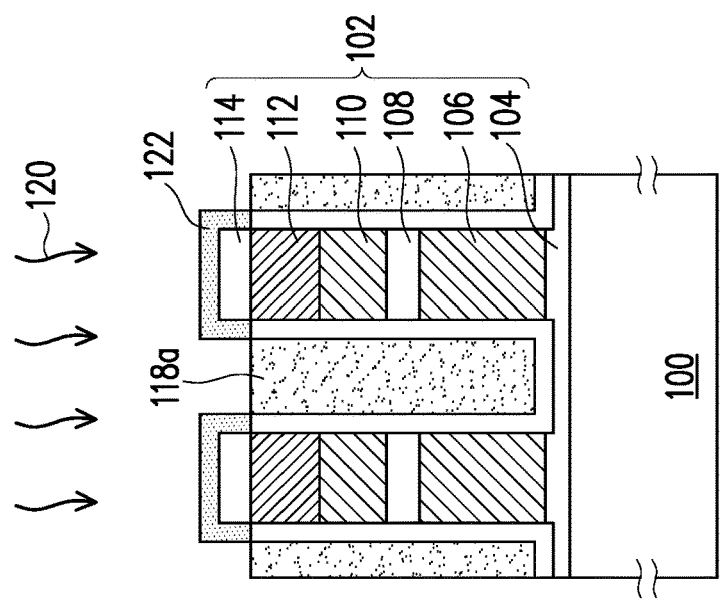

Referring to FIG. 1E, a nitridation treatment 120 is performed to nitride the upper portion 116u of the nitride layer 116 into a first cap layer 122 (also referred to as a cap structure 22). In the embodiment, a material of the first cap layer 122 includes nitride, such as silicon nitride. A nitrogen concentration of the first cap layer 122 may be higher than a nitrogen concentration of the nitride layer 116, and a hardness of the first cap layer 122 may also be higher than a hardness of the nitride layer 116.

In some embodiments, the nitridation treatment 120 includes a plasma nitridation process. It should be noted that a process temperature of the plasma nitridation process may be lower than 500° C. (e.g., about 23° C. to 500° C.) to avoid deformation of the metal layer 112. A process time of the plasma nitridation process may be between 30 seconds and 120 seconds, such as 90 seconds. In the embodiment, the nitridation treatment 120 further includes an annealing process after performing the plasma nitridation process, so as to more solidify or strengthen the first cap layer 122. The annealing process may be a post-nitridation annealing (PNA) process or a rapid thermal annealing (RTA) process. A process temperature of the annealing process may be lower than 900° C. (e.g., about 600° C. to 900° C.) to avoid deformation of the metal layer 112. The process time of the annealing process may be between 30 seconds and 120 seconds, such as 30 seconds.

Figure 1F:
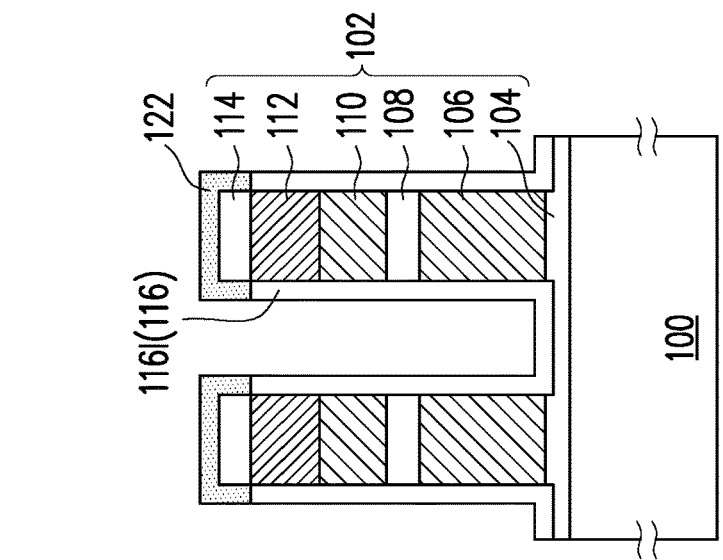

Referring to FIG. 1F, after the nitridation treatment 120, the sacrificial pattern 118a is removed to expose a lower portion 116l of the nitride layer 116.

Referring to FIG. 1G, an etching process is performed to thin or trim the lower portion 116l of the nitride layer 116. In the case, a thickness 116t of the thinned lower portion (or remaining portion) 116r of the nitride layer 116 may be less than or equal to 2 nm, so as to facilitate the subsequent oxidation process. That is, when the thickness 116t of the thinned lower portion 116r of the nitride layer 116 is greater than 2 nm, in the subsequent oxidation process, a portion of the nitride layer cannot be oxidized and remains on the sidewalls of the word-line structures 102, which results in increasing the parasitic capacitance between word-line structures 102.

In some embodiments, the etching process includes a wet etching process by using a diluted hydrofluoric acid (DHF) solution. Since the nitridation treatment 120 has cured or strengthened the first cap layer 122, the diluted hydrofluoric acid solution will only remove a large amount of the nitride layer 116, but will not remove or remove a small amount of the first cap layer 122.

Referring to FIG. 1G and FIG. 1H, an oxidation process 124 is performed to oxidize the thinned lower portion 116r of the nitride layer 116 to an oxide layer 126. In some embodiments, the oxidation process 124 includes a Slot Plane Antenna (SPA) process. The SPA process is a process that uses a microwave slot antenna to generate plasma to form an oxide. Compared with the furnace process, the SPA process has a lower process temperature to avoid deformation of the metal layer 112. In addition, when the thickness 116t of the thinned lower portion 116r of the nitride layer 116 is less than or equal to 2 nm, the SPA process can completely oxidize the thinned lower portion 116r to the oxide layer 126 without remaining any unoxidized nitride layer on the sidewalls of word-line structures 102. In the embodiment, the oxidation process 124 includes introducing the process gases including Hz, $O_2$, and Ar. $H_2$ may be regarded as a reducing agent, and $O_2$ may be regarded as an oxidizing agent. When a content of $H_2$ is greater than a content of $O_2$, the oxidation process 124 will only oxidize the nitride layer 116r to the oxide layer 126 without further oxidizing the metal layer 112. In the embodiment, a ratio of $H_2$ to $O_2$ is 2:1 to 4:1. Moreover, the exposed first cap layer 122 may also be further oxidized by the oxidation process 124, so that the oxide layer 126 extends to cover the surface of the first cap layer 122. In the case, the lower portion 126a of the oxide layer 126 covering the word-line structures 102 has a thickness of 126t1, and the upper portion 126b of the oxide layer 126 covering the first cap layer 122 has a thickness of 126t2. The thickness 126t1 may be greater than the thickness 126t2. Further, the upper portion 126b of the oxide layer 126 may continuously or discontinuously cover the surface of the first cap layer 122.

Referring to FIG. 1I, the oxide layer 126 is removed to expose the first cap layer 122 and the lower portion 102a of the word-line structures 102, while the first cap layer 122 covers the upper portion 102b of the word-line structures 102. Specifically, the first cap layer 122 may cover the top surface and sidewalls of the hard mask layer 114.

Figure 1J:
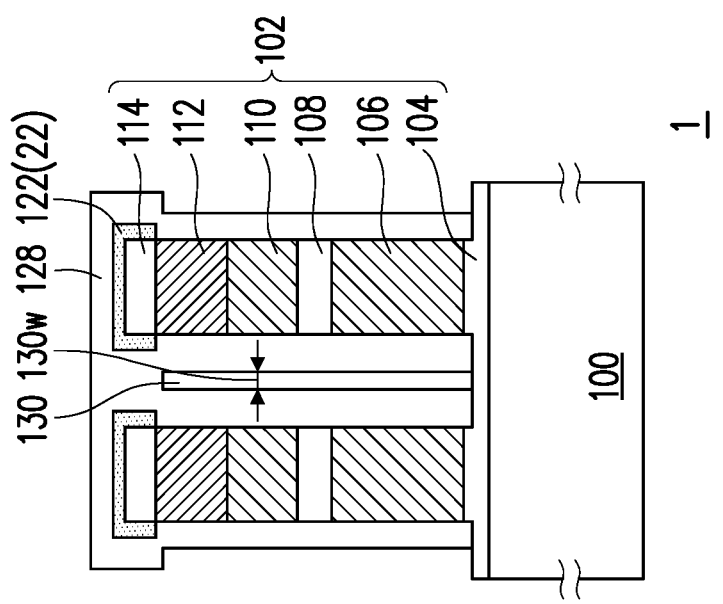

Referring to FIG. 1J, after removing the oxide layer 126, a dielectric layer 128 may be formed on the first cap layer 122, thereby accomplishing a memory device 1. In some embodiments, a material of the dielectric layer 128 includes silicon oxide or other low dielectric constant material (the dielectric constant k is less than 3.9). Specifically, as shown in FIG. 1J, the dielectric layer 128 may extend to cover the sidewalls of two adjacent word-line structures 102, so as to form an air gap 130 between the two adjacent word-line structures 102. However, the present invention is not limited thereto. In other embodiments, when the distance between two adjacent first cap layers 122 (or cap structure 22) is small enough, the dielectric layer 128 may not extend into the space between two adjacent word-line structures 102, so that the air gap 130 is in direct contact with the sidewalls of two adjacent word-line structures 102.

It should be noted that as the integration density of the memory devices continues to increase, the Resistor-Capacitor delay (RC delay) between the word-line structures 102 and the coupling interference between the floating gates 106 (or metal layers 112) will increase accordingly. In order to solve the above-mentioned problems, the present embodiment can form the air gap 130 (its dielectric constant k=1) between the word-line structures 102 by the above-mentioned forming method, so as to effectively reduce the parasitic capacitance between the word-line structures 102, thereby decreasing the RC delay between the word-line structures 102 and enhancing the program speed of the memory device 1. In addition, the air gap 130 can also improve the coupling interference between the word-line structures 102 and endurance, thereby enhancing the reliability of the memory device 1.

On the other hand, in addition to the word-line structure in the flash memory, the present invention can also be applied to a dynamic random access memory (DRAM). Specifically, the present invention can effectively reduce the parasitic capacitance between the bit-line structures of the DRAM, so as to reduce the RC delay between the bit-line structures and improve the coupling interference between the bit-line structures, thereby enhancing the reliability of the DRAM. Of course, the present invention may also be applied to other memory fields.

Moreover, the above-mentioned forming methods illustrated in FIG. 1A to FIG. 1J can further maximize the air gap ratio between the word-line structures, so as to further improve the performance and reliability of the memory device. Please refer to the following examples for details.

Figure 2B:
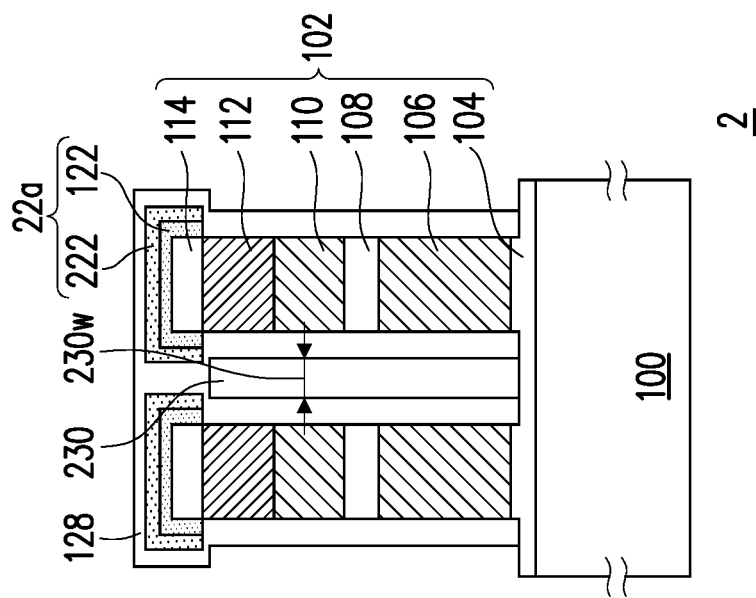
FIG. 2A to FIG. 2B are schematic cross-sectional views illustrating a manufacturing process of a memory device according to a second embodiment of the invention.
Figure 2A:
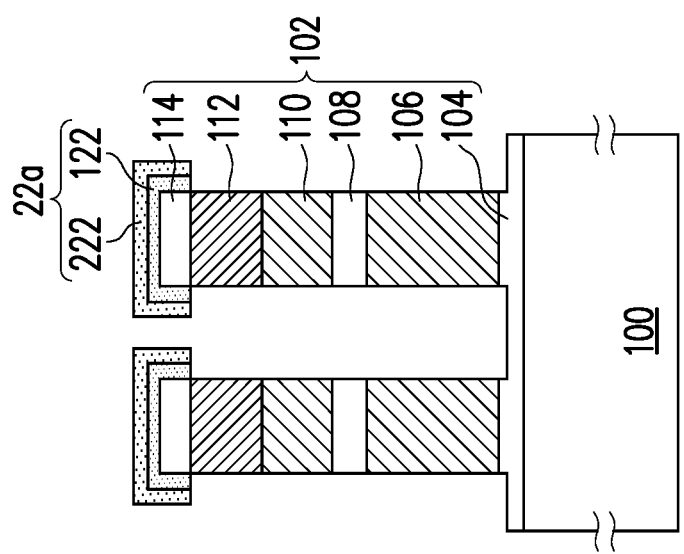

FIG. 2A to FIG. 2B are schematic cross-sectional views illustrating a manufacturing process of a memory device according to a second embodiment of the invention.

Referring to FIG. 2A, the structure of FIG. 2A is formed by repeating the steps of FIG. 1B to FIG. 1I at least once on the structure of FIG. 1I, so as to form a second cap layer 222 on the first cap layer 122. In the embodiment, the first cap layer 122 and the second cap layer 222 thereon may be referred to as a cap structure 22a. The first cap layer 122 and the second cap layer 222 may have the same material, such as silicon nitride. The nitrogen concentration of the first cap layer 122 may be higher than the nitrogen concentration of the second cap layer 222. That is, the nitrogen concentration of the cap structure 22a decreases along a direction near to a corresponding word-line structure 102 toward far away from the corresponding word-line structure 102.

Next, referring to FIG. 2B, a dielectric layer 128 is formed on the cap structure 22a, thereby accomplishing a memory device 2. Specifically, as shown in FIG. 2B, the dielectric layer 128 may extend to cover the sidewalls of two adjacent word-line structures 102, so as to form an air gap 230 between the two adjacent word-line structures 102.

It should be noted that, compared to the cap structure 22 consisting of a single-layered structure in the memory device 1, the cap structure 22a consisting of a two-layered structure in the memory device 2 has a thicker thickness. In the case, a distance between adjacent cap structure 22a is relatively small, so that the dielectric layer 128 is not easy to fill into the space between two adjacent word-line structures 102. As shown in FIG. 1J and FIG. 2B, a width 230w of the air gap 230 of the memory device 2 may be greater than a width 130w of the air gap 130 of the memory device 1. When the air gap ratio of the memory device 2 increases, the parasitic capacitance between the word-line structures 102 will also decrease accordingly, so as to reduce the RC delay between the word-line structures 102 and increase the program speed of the memory device 2. In addition, the air gap 230 can also improve the coupling interference between the word-line structures 102 and endurance, thereby enhancing the reliability of the memory device 2.

On the other hand, when the distance between the cap structure 22a of the memory device 2 is small enough, the dielectric layer 128 may not extend into the space between two adjacent word-line structures 102, so that the air gap 230 is in direct contact with the sidewalls of two adjacent word-line structures 102.

Figure 3B:
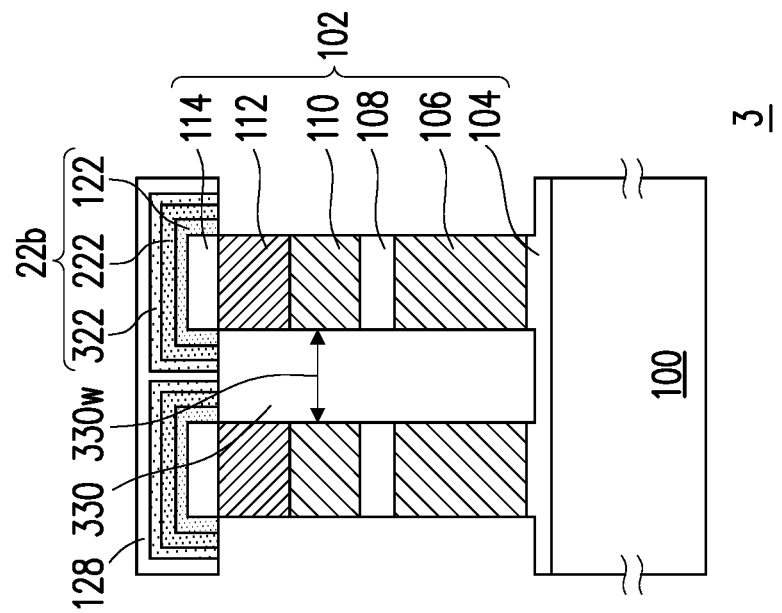
FIG. 3A to FIG. 3B are schematic cross-sectional views illustrating a manufacturing process of a memory device according to a third embodiment of the invention.
Figure 3A:
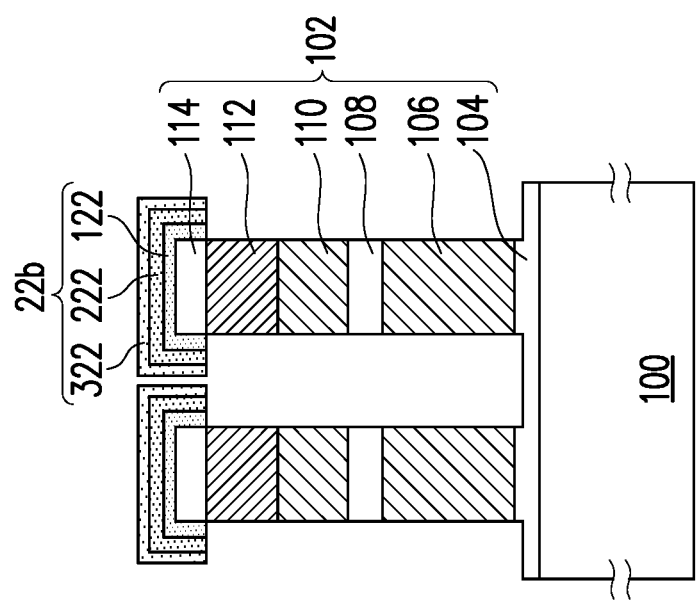

FIG. 3A to FIG. 3B are schematic cross-sectional views illustrating a manufacturing process of a memory device according to a third embodiment of the invention.

Referring to FIG. 3A, the structure of FIG. 3A is formed by repeating the steps of FIG. 1B to FIG. 1I at least twice on the structure of FIG. 1I, so as to form a second cap layer 222 on the first cap layer 122 and form a third cap layer 322 on the second cap layer 222. In the embodiment, the three-layered structure consisting of the first cap layer 122, the second cap layer 222, and the third cap layer 322 may be referred to as a cap structure 22b. However, the present invention is not limited thereto. In other embodiments, the steps of FIG. 1B to FIG. 1I may be repeated multiple times to form a plurality of cap layers on the first cap layer 122, thereby forming the cap structure with the multi-layered structure. In the present embodiment, the first cap layer 122, the second cap layer 222, and the third cap layer 322 may have the same material, such silicon nitride. The nitrogen concentration of the first cap layer 122 may be higher than the nitrogen concentration of the second cap layer 222, and the nitrogen concentration of the second cap layer 222 may be higher than the nitrogen concentration of the third cap layer 322. In other words, the nitrogen concentration of the cap structure 22b decreases along a direction near to a corresponding word-line structure 102 toward far away from the corresponding word-line structure 102.

Next, referring to FIG. 3B, a dielectric layer 128 is formed on the cap structure 22b, thereby accomplishing a memory device 3. In the present embodiment, as shown in FIG. 3B, since the distance between two adjacent cap structures 22b is too close, the dielectric layer 128 cannot fill into the space between two adjacent word-line structures 102, while the dielectric layer 128 seals the space between two adjacent word-line structures 102 to form an air gap 330. Specifically, the air gap 330 is in direct contact with the sidewalls of two adjacent word-line structures 102. In the case, as shown in FIG. 2B and FIG. 3B, a width 330w of the air gap 330 of the memory device 3 may be greater than the width 230w of the air gap 230 of the memory device 2. As a result, the air gap ratio of the memory device 3 can be further maximized to effectively reduce the parasitic capacitance and RC delay between the word-line structures 102, thereby enhancing the performance and reliability of the memory device 3.

In addition, although a bottom surface of the dielectric layer 128 shown in FIG. 3B is flush with a bottom surface of the cap structure 22b, the present invention is not limited thereto. In other embodiments, the bottom surface of the dielectric layer 128 may be higher than the bottom surface of the cap structure 22b. Further, in alternative embodiments, two adjacent cap structures 22b may also be connected to each other, so that the dielectric layer 128 does not fill the space between two adjacent cap structures 22b.

In summary, in the embodiment of the present invention, the cap structure with the single-layered or multi-layered structure is formed on the word-line structure, so as to control the amount of the dielectric layers subsequently filling the space between adjacent word-line structures, thereby maximizing the air gap ratio between the word-line structures. In the case, the said maximized air gap ratio is able to effectively increase the program speed and endurance of the memory device, and improve the coupling interference between the word-line structures, thereby increasing the reliability of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a plurality of word-line structures, disposed on a substrate;
   a plurality of cap structures, respectively disposed on the plurality of word-line structures, wherein each cap structure at least comprises:
   a first silicon nitride layer, conformally covering and directly contacting a top surface and an upper sidewall of a corresponding word-line structure, and exposing a lower sidewall of the corresponding word-line structure;
   a second silicon nitride layer, conformally covering the first silicon nitride layer; and
   a third silicon nitride layer, conformally covering the second silicon nitride layer, wherein the first silicon nitride layer has a nitrogen concentration higher than a nitrogen concentration of the second silicon nitride layer, and the nitrogen concentration of the second silicon nitride layer is higher than a nitrogen concentration of the third silicon nitride layer; and
   a plurality of air gaps, respectively disposed between the plurality of word-line structures, wherein the plurality of air gaps are in direct contact with the lower sidewall of the plurality of word-line structures.

2. The memory device according to claim 1, wherein each word-line structure comprises:
   a tunneling dielectric layer;
   a floating gate, disposed on the tunneling dielectric layer;
   a control gate, disposed on the floating gate;

an inter-gate dielectric layer, disposed between the floating gate and the control gate;
a metal layer disposed on the control gate; and
a hard mask layer, disposed on the metal layer.

3. The memory device according to claim 2, wherein one of the plurality of cap structures covers a top surface and a sidewall of the hard mask layer.

4. The memory device according to claim 2, further comprising a dielectric layer disposed on the plurality of cap structures and extending between two adjacent cap structures.

5. The memory device according to claim 1, wherein each cap structure further comprises a multi-layered structure, and the multi-layered structure comprises more than three silicon nitride layers.

6. The memory device according to claim 1, wherein two adjacent cap structures are connected to each other.

7. A memory device, comprising:
a plurality of word-line structures, disposed on a substrate;
a plurality of cap structures, respectively disposed on the plurality of word-line structures, wherein each cap structure at least comprises:
  a first silicon nitride layer, conformally covering and directly contacting a top surface and an upper sidewall of a corresponding word-line structure, and exposing a lower sidewall of the corresponding word-line structure; and
  a second silicon nitride layer conformally covering the first silicon nitride layer, wherein the first silicon nitride layer has a nitrogen concentration higher than a nitrogen concentration of the second silicon nitride layer; and
a dielectric layer, conformally covering the second silicon nitride layer and extending to cover the lower sidewall of the plurality of word-line structures, wherein the dielectric layer between the plurality of word-line structures is connected to each other at the upper sidewall of the plurality of word-line structures, so as to form a plurality of air gaps in the dielectric layer between the plurality of word-line structures.

8. The memory device according to claim 7, wherein each word-line structure comprises:
a tunneling dielectric layer;
a floating gate, disposed on the tunneling dielectric layer;
a control gate, disposed on the floating gate;
an inter-gate dielectric layer, disposed between the floating gate and the control gate;
a metal layer disposed on the control gate; and
a hard mask layer, disposed on the metal layer.

9. The memory device according to claim 7, wherein each cap structure comprises a multi-layered silicon nitride layer structure.

10. The memory device according to claim 7, wherein the dielectric layer is in direct contact with a surface of the second silicon nitride layer and the lower sidewall of the plurality of word-line structures.

* * * * *